US011538989B2

(12) United States Patent
Velasquez et al.

(10) Patent No.: US 11,538,989 B2
(45) Date of Patent: Dec. 27, 2022

(54) 3-D CROSSBAR ARCHITECTURE FOR FAST ENERGY-EFFICIENT IN-MEMORY COMPUTING OF GRAPH TRANSITIVE CLOSURE

(71) Applicant: UNIVERSITY OF CENTRAL FLORIDA RESEARCH FOUNDATION, INC., Orlando, FL (US)

(72) Inventors: Alvaro Velasquez, Orlando, FL (US); Sumit Kumar Jha, Oviedo, FL (US)

(73) Assignee: UNIVERSITY OF CENTRAL FLORIDA RESEARCH FOUNDATION, INC., Orlando, FL (US)

( * ) Notice: Subject to any disclaimer, the term of this patent is extended or adjusted under 35 U.S.C. 154(b) by 904 days.

(21) Appl. No.: 16/048,958

(22) Filed: Jul. 30, 2018

(65) Prior Publication Data
US 2019/0051825 A1 Feb. 14, 2019

Related U.S. Application Data

(60) Provisional application No. 62/539,122, filed on Jul. 31, 2017.

(51) Int. Cl.
*H01L 45/00* (2006.01)
*G06F 3/06* (2006.01)
(Continued)

(52) U.S. Cl.
CPC .......... *H01L 45/122* (2013.01); *G06F 3/0683* (2013.01); *G06F 17/16* (2013.01);
(Continued)

(58) Field of Classification Search
CPC . H01L 45/122; H01L 29/0673; H01L 29/127; H01L 27/2481; G06F 3/0683;
(Continued)

(56) References Cited

U.S. PATENT DOCUMENTS 7,792,894 B1 * 9/2010 Cohn .................... G06F 17/16
708/607
8,680,906 B1 3/2014 McDonald et al.
(Continued)

FOREIGN PATENT DOCUMENTS

WO WO-2017106863 A1 * 6/2017 .............. G06F 11/36

*Primary Examiner* — Fernando Hidalgo
(74) *Attorney, Agent, or Firm* — Preti Flaherty Beliveau & Pachios LLP

(57) ABSTRACT

An in-memory computing architecture is disclosed that can evaluate the transitive closure of graphs using the natural parallel flow of information in 3-D nanoscale crossbars. The architecture can be implemented using 3-D crossbar architectures with as few as two layers of 1-diode 1-resistor (1D1R) interconnects. The architecture avoids memory-processor bottlenecks and can hence scale to large graphs. The approach leads to a runtime complexity of $O(n^2)$ using $O(n^2)$ memristor devices. This compares favorably to conventional algorithms with a time complexity of $O((n^3)/p + (n^2) \log p)$ on p processors. The approach takes advantage of the dynamics of 3-D crossbars not available on 2-D crossbars.

5 Claims, 9 Drawing Sheets

(51) Int. Cl.
  *G11C 14/00* (2006.01)
  *G11C 13/00* (2006.01)
  *H01L 29/06* (2006.01)
  *G11C 7/10* (2006.01)
  *H01L 29/12* (2006.01)
  *G06F 17/16* (2006.01)
  *B82Y 10/00* (2011.01)

(52) U.S. Cl.
  CPC .......... *G11C 7/1006* (2013.01); *G11C 13/003* (2013.01); *G11C 13/004* (2013.01); *G11C 13/0007* (2013.01); *G11C 13/0023* (2013.01); *G11C 13/0069* (2013.01); *G11C 14/009* (2013.01); *G11C 14/0009* (2013.01); *H01L 29/0673* (2013.01); *H01L 29/127* (2013.01); *B82Y 10/00* (2013.01); *G11C 2213/71* (2013.01); *G11C 2213/72* (2013.01)

(58) Field of Classification Search
  CPC ... G06F 17/16; G11C 7/1006; G11C 13/0007; G11C 13/0023; G11C 13/003; G11C 13/004; G11C 13/0069; G11C 14/0009; G11C 14/009; G11C 2213/71; G11C 2213/72; B82Y 10/00
  USPC ........................................................ 711/202
  See application file for complete search history.

(56) References Cited

U.S. PATENT DOCUMENTS

| | | | |
|---|---|---|---|
| 8,935,137 | B1* | 1/2015 | Han ........................ G06F 17/13 703/6 |
| 9,319,047 | B2 | 4/2016 | Jha et al. |
| 2008/0235315 | A1* | 9/2008 | Aslam ................... G06N 5/003 708/446 |
| 2013/0334485 | A1 | 12/2013 | Yang et al. |
| 2015/0170025 | A1 | 6/2015 | Wu et al. |
| 2015/0171868 | A1 | 6/2015 | Rodriguez et al. |
| 2018/0373527 | A1* | 12/2018 | van Schaik ........... G06F 11/327 |
| 2020/0143476 | A1* | 5/2020 | Sandhu .................. H04L 67/40 |

* cited by examiner

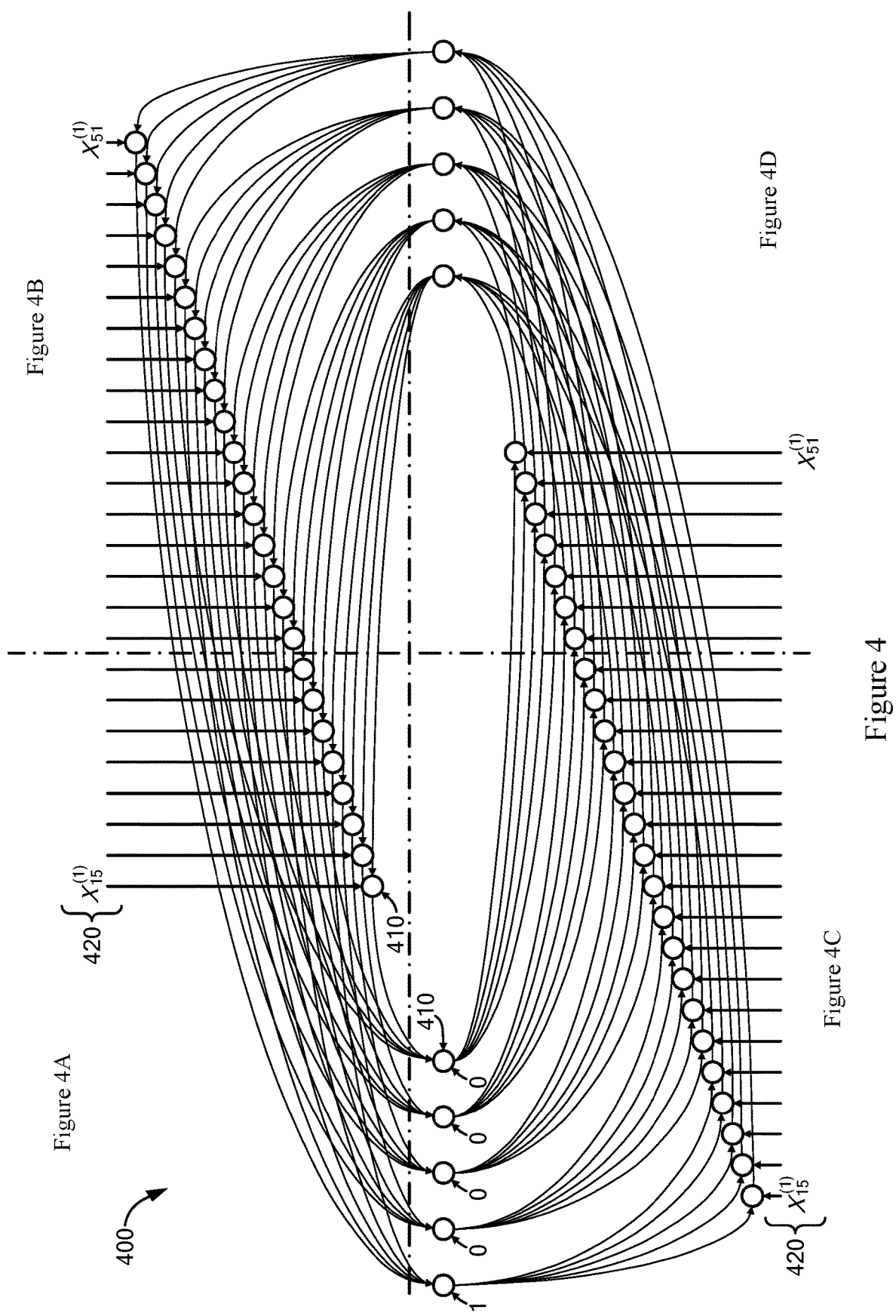

3-D CROSSBAR ARCHITECTURE FOR FAST ENERGY-EFFICIENT IN-MEMORY COMPUTING OF GRAPH TRANSITIVE CLOSURE

STATEMENT REGARDING FEDERALLY SPONSORED RESEARCH OR DEVELOPMENT

This invention was made with government support under Award Number 1438989 awarded by the National Science Foundation; under Funding Identification Number 1059465 awarded by the Air Force Office of Scientific Research Young Investigator Program, and an award in 2015 by the NSF Graduate Research Fellowship Program to Alvaro Velasquez. The government has certain rights in the invention.

BACKGROUND OF THE INVENTION

Various embodiments relate generally to computing systems, methods, devices and computer programs and, more specifically, relate to 3-D crossbar architecture for in-memory computing.

This section is intended to provide a background or context. The description may include concepts that may be pursued, but have not necessarily been previously conceived or pursued. Unless indicated otherwise, what is described in this section is not deemed prior art to the description and claims and is not admitted to be prior art by inclusion in this section.

Structured big data is being generated at a high volume due to the ongoing revolution in electronic sensing and communication. According to the International Data Corporation, the amount of data is expected to double every two years since 2012, with an estimated 300 times more data in 2020 than in 2005 from 130 exabytes to a whopping 40 zettabytes.

Computing with structured big data, such as graphs, on current high-performance machines is exacerbated by two issues. First, conventional DRAM and SRAM memories are volatile and their stored data is lost when the power source is removed from the system. Consequently, these architectures use a constant supply of power to refresh the stored data, resulting in poor energy efficiency. Thus, working with large graphs is energetically expensive and takes a long period of time. The analysis of huge networks can use lots of energy, for example, some modern supercomputers are tied to a nuclear reactor to power them.

It is clear that in order to meet the energy demands of the future, computer systems can be expected to move away from volatile memory. Fortunately, much work is being done in this area. HP has announced their plans of building the Machine with non-volatile memory. Intel and Micron recently unveiled their groundbreaking 3D XPoint™ memory architecture—a 3-dimensional crossbar architecture with two layers of non-volatile interconnections. HP and Sandisk have also announced a partnership for investigating the area of memory-driven computing in the hopes of leveraging their memristor and non-volatile resistive RAM technologies.

Though a useful step in the right direction, upgrading to a non-volatile technology may not be enough on its own as there is a second problem in high-performance computing: the infamous memory wall that arises in traditional von Neumann architectures where the memory and the processing units are segregated. This separation poses serious restrictions on performance. Under a 45 nm process at 0.9 V, it has been reported that 32-bit floating-point multiplication consumes approximately 4 pJ of energy whereas accessing DRAM uses 1.3-2.6 nJ. There is a difference of three orders of magnitude in power consumption between computation and memory access in this case.

What is needed is an approach which improves on both the energy and time used by computers when evaluating large graphs. Such an approach could enable analyzing a million node graph using a fraction of the energy spent by a desktop.

SUMMARY

The below summary is merely representative and non-limiting.

The above problems are overcome, and other advantages may be realized, by the use of the embodiments.

In a first aspect, an embodiment provides a method for computing a transitive closure of a directed graph. The method includes implementing a Boolean circuit model of a 3D crossbar memory for in-memory parallel computation of a matrix X based on the directed graph. The Boolean circuit model having at least one external feedback loop. For each row in the matrix, the method performs repeated Boolean matrix multiplication of the matrix X so as to generate a converged wire vector associated with the given row in the matrix. Combining the converged wire vectors to generate a transitive closure matrix $X^*$ is performed. The method also includes outputting the transitive closure matrix $X^*$.

BRIEF DESCRIPTION OF THE SEVERAL VIEWS OF THE DRAWINGS

Aspects of the described embodiments are more evident in the following description, when read in conjunction with the attached Figures.

FIG. 4 illustrates a cyclic Boolean circuit for the procedure in FIG. 3.

DETAILED DESCRIPTION OF THE INVENTION

This patent application claims priority from U.S. Provisional Patent Application No. 62/539,122, filed Jul. 31, 2017, the disclosure of which is incorporated by reference herein in its entirety.

Various embodiments use a 3-D computing fabric to design a computing system that can efficiently compute transitive closures in graphs. It may be implemented using a 3-D crossbar with 2-layers of 1-diode 1-resistor interconnects. A program for finding transitive closure in graph using this architecture can run faster than conventional methods and can save energy. Such embodiments may be used for ASIC implementing graph algorithms in hardware. Various embodiments provide an in-memory computing architecture that can compute the transitive closure of graphs within non-volatile 3D resistive memory (D RRAM) with external feedback loops. The approach has a runtime complexity of $O(n^2)$ using $O(n^2)$ devices. In practice, various embodiments provide methods that are both fast and energy-efficient (see Table 4).

Due to great advancements in memristor-based memory technologies, the field of crossbar computing in 2-dimensional memories has garnered much interest in recent years. Many of the proposed digital computing architectures are derived from memristor implication logic and paths-based logic. However, computation within 3D memories has gone largely unexplored.

Graph transitive closure and all-pairs shortest path are problems in many applications, including formal verification, database queries, parsing grammars and data dependencies during compilation.

Parallel graph libraries using MPI and in-memory software are popular. The arrival of 3-D memories in the consumer market in the next 2-5 years will enable end-users to easily replace their software solutions with hardware solutions which implement various embodiments.

Companies are interested in memristors (HP, Sandisk, Intel, Crossbar Inc) as these memristors are often used as the key component of nonvolatile memories. Contractors may also be interested in various embodiments for low-energy solutions.

Designers of high-performance computing machines and ASIC designers who want to implement graph algorithms in hardware may be interested in various embodiments. With the rise of open-stack hardware solutions, such application-specific designs are likely to replace general-purpose hardware in both the embedded systems and the high-performance computing market.

A sets of memristors may be organized into a crossbar networks having rows of parallel nanowires electrodes, row-nanowires, and columns of parallel nanowire electrodes, column-nanowires, perpendicular to the row-nanowires and a memristor at each cross-point.

Figure 1A:
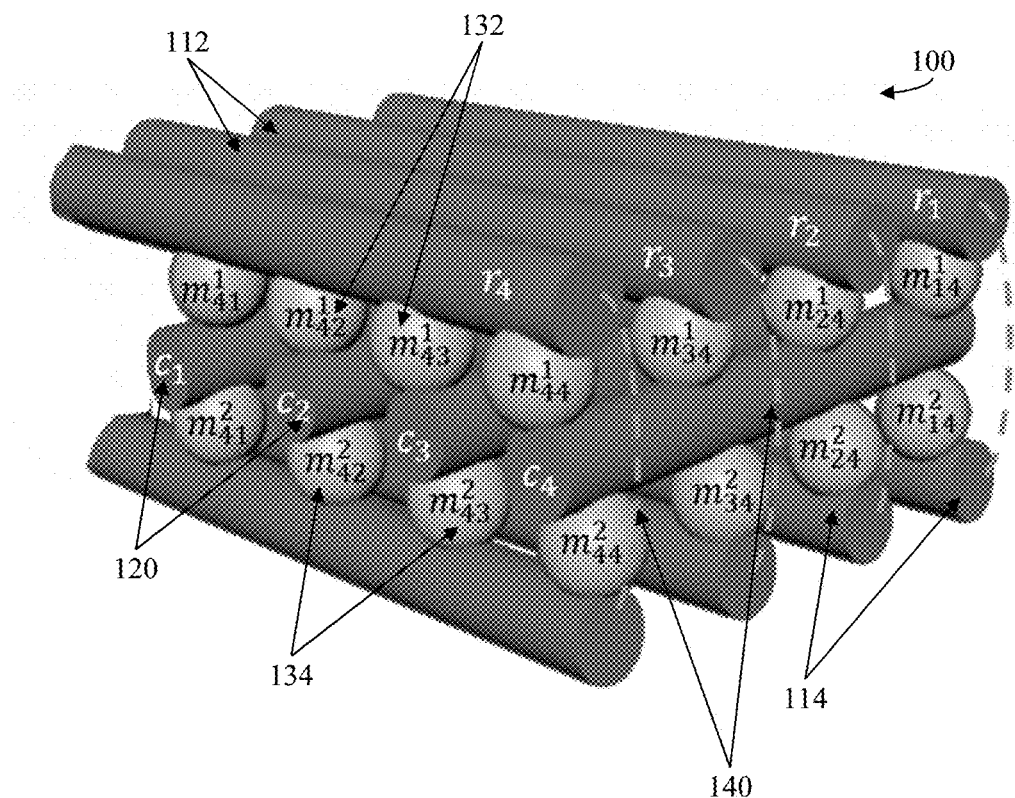
FIGS. 1A-1B, collectively referred to as FIG. 1, illustrate a 3-D crossbar with two layers of interconnections.
Figure 1B:
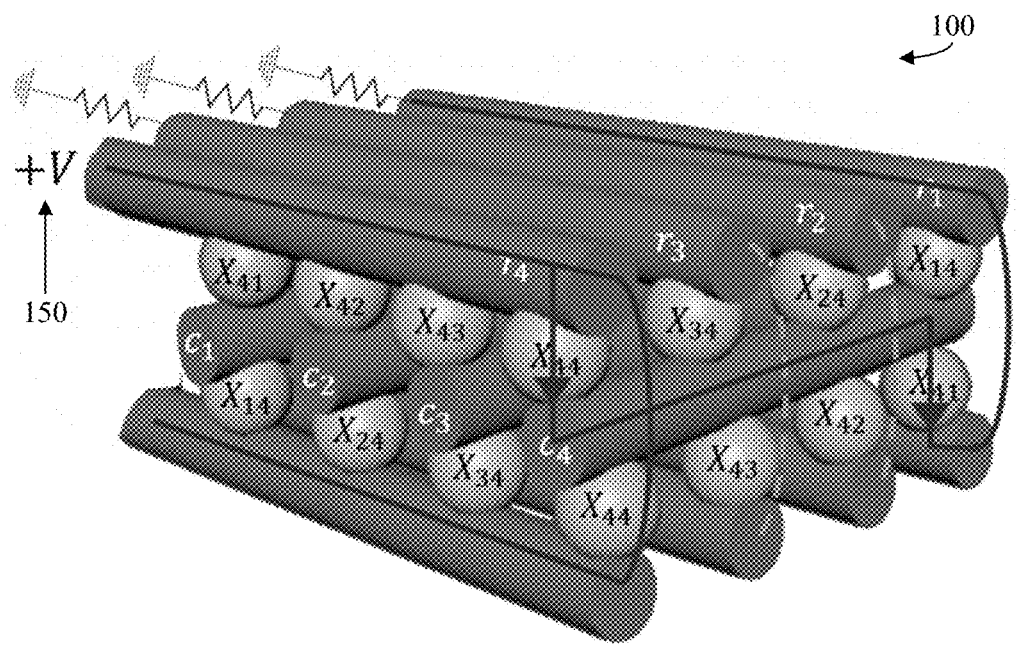

FIGS. 1A-1B, collectively referred to as FIG. 1, illustrate a 3-D crossbar 100 with two layers of interconnections. FIG. 1A is a graphical illustration of a 3D crossbar 100 $C=(M^1, M^2, R, C)$ with two layers of interconnects 112, 114 and external feedback loops. The dashed arcs 140 denote an external interconnection between the corresponding bottom nanowires 112 and top nanowires 114. Memristers 132, 134 are located at the intersections of row nanowires 112, 114 and column nanowires 120.

FIG. 1B shows a graphical illustration of the 3-D crossbar 100 with two layers of interconnects and external feedback loops. Given $X=(0\ 0\ 0\ 0),(0\ 1\ 0\ 0),(0\ 0\ 1\ 0),(1\ 0\ 0\ 1))$, the crossbar 100 is configured in accordance with Theorem1 (see below) so that $M^1=X$ and $M^2=X^T$. In order to compute the $4^{th}$ row vector of the transitive closure of X, a voltage bias 150 is applied to $r_4$ and $r_1, r_2, r_3$ are grounded. The voltage readings obtained from $(r_1, r_2, r_3, r_4)$ correspond to (1,0,0,1), as expected.

3-D nonvolatile memories are new and there is interest in designing new kinds of computing systems using 3-D memories. Graph transitive closure has been a problem with several practical applications and various embodiments can be used to provide a new way to design computing systems using 3-D memories for computing transitive closure. These approaches are faster and more energy-efficient than existing computing architectures.

The computational fabric used herein is a 3D crossbar memory with two layers of 1-diode 1-resistor (1D1R) interconnects. In one approach, the top and bottom rows or nanowires of the crossbar are connected to each other using individual external connections as shown in FIG. 1. Definition 1 presents an abstraction of the 3D crossbar architecture.

Definition 1: An n×n 3D crossbar with two externally interconnected layers is a 4-tuple $C=(M^1, M^2, R, C)$, where $$\bullet\ M^k = \begin{pmatrix} m_{11}^k & m_{12}^k & \ldots & m_{1n}^k \\ \vdots & \vdots & \ddots & \vdots \\ m_{n1}^k & m_{n2}^k & \ldots & m_{nn}^k \end{pmatrix}$$

is a Boolean matrix representing the interconnects with n rows and n columns. Each in $m_{ij}^k=1$ denotes the state of the device connecting row i with column J in layer $k \in \{1,2\}$. $m_{ij}^k=1$ denotes a 1D1R device in the low-resistance state (LRS) state and $m_{ij}^k=0$ denotes the same device in a high-resistance state (HRS).

$R=\{r_1, \ldots, r_n\}$ is a vector of row nanowire values and $r_i \in \{0,1\}$ provides the same input voltage to every component $m_{ij}^1$ in the first layer. External feedback loops connect the bottommost row nanowires with the corresponding topmost nanowires. Hence, it is enough to model both the topmost and bottommost rows or nanowires using the same vector of values.

$C=\{c_1, \ldots, c_n\}$ is a vector of column nanowire values and $c_j \in \{0,1\}$ provides the same input to every component $m_{ij}^2$ in the second layer of the 3D crossbar.

In Definition 1, a nanowire value of 1 denotes a high voltage value (with respect to ground) and 0 denotes a negligible voltage value. The LRS state is analogous to a closed switch, e.g., a component that allows current to flow from one terminal to the next. Conversely, the HRS state functions as an open switch; namely, it impedes the flow of current. Since each 1D1R component contains a diode, current will only flow in one direction when said component is in the LRS state. Without loss of generality, $m_{ij}^1$ and $m_{ij}^2$ allow current to flow from wire $r_i$ to $c_j$ and $c_j$ to $r_i$, respectively. As used herein, the terms interconnect, component, and device are interchangeable.

Traditional RRAM possesses a very similar structure to the one just defined. However, these resistive memories are 2-dimensional. Namely, there is a single layer of interconnects. These interconnects consist of one selector and one resistive element (1S1R). The selector is usually a transistor (1T1R) or diode (1D1R), with 1D1R being preferable to 1T1R as the former leads to much more dense crossbars at the cost of higher programming voltages.

In order to frame the dynamics of 3D crossbars within the framework of a well-studied computational model, the foregoing dynamics are represented as a Boolean circuit. In this Boolean circuit, the value of each wire $r_i, c_j$ is denoted by a Boolean function $g_i^r, g_j^c$. Similarly, the outputs of components $m_{ij}^1, m_{ij}^2$ are defined by Boolean functions $g_{ij}^1, g_{ij}^2$. These functions are defined below.

Given a 3D crossbar $C=(M^1, M^2, R, C)$—in order to induce a flow of current through the crossbar, a voltage bias is applied to some row wire $r_i$ and other wire(s) are grounded. The trajectory of current will depend on the configuration of the interconnect matrices $M^1, M^2$. Due to the unidirectional flow of current imposed by 1D1R interconnects, current will flow from wire $r_i$ to $c_j$ if $m_{ij}^1$ is in the LRS state and wire $r_i$ has a high voltage with respect to ground (e.g. $m_{ij}^1=1$ and $r_i=1$). Similarly, current will flow from $c_j$ to $r_i$ when $m_{ij}^2=1$ and $c_j=1$. The outputs of components $m_{ij}^1$ and $m_{ij}^2$ are defined by $g_{ij}^1(r_i,m_{ij}^1)=r_i\wedge m_{ij}^1$ and $g_{ij}^2(c_j,m_{ij}^2)=c_j\wedge m_{ij}^2$, respectively. The values of $r_i$ and $c_j$ are defined by equations (1) and (2). This behavior is well-captured by a cyclic Boolean circuit. See FIG. 2 for a pictorial definition.

$$c_j = g_j^c(g_{1j}^1(r_1, m_{1j}^1), \ldots, g_{nj}^1(r_n, m_{nj}^1)) \qquad (1)$$
$$= \bigvee_{i=1}^{n}(r_i \wedge m_{ij}^1)$$

$$r_i = g_i^r(I_i, g_{i1}^2(c_1, m_{i1}^2), \ldots, g_{in}^2(c_n, m_{in}^2)) \qquad (2)$$
$$= I_i \vee \bigvee_{j=1}^{n}(c_j \wedge m_{ij}^2)$$

In order to capture the dynamics of the feedback loop, the flow of information is modeled in the crossbar through a discrete notion of time. Let $r_{i,t}$ and $c_{j,t}$ denote the state of wires $r_i$ and $c_j$ during the $t^{th}$ iteration of the feedback loop. At time $t=0$, $r_{i,0}=I_i=1$ if a voltage source is applied to wire $r_i$ and $r_{i,0}=I_i=0$ denotes a grounded wire. The values of the wires then evolve from $t=1$ onwards according to equations (3) and (4).

$$c_{j,t} = \bigvee_{i=1}^{n}(r_{i,t-1} \wedge m_{ij}^1) \qquad (3)$$

$$r_{i,t} = \bigvee_{j=1}^{n}(c_{j,t} \wedge m_{ij}^2) \qquad (4)$$

Equation (3) suggests that column j has a flow of current if and only if a row nanowire $r_i$ has a flow at time $t-1$ and the corresponding component $m_{ij}^1$ is in the LRS state in the first layer of the 3D crossbar. Similarly, equation (4) describes the fact that row $r_i$ has a new flow of current at time t if and only if a column nanowire $c_j$ has a flow at time t and the corresponding component $m_{ij}^2$ is in the LRS state in the second layer. While the state of the flows in the nanowires changes as time evolves, the states of the interconnects are set at time $t=0$ and do not evolve. Essentially, the interconnects store the data values in the 3D crossbar while the interconnecting nanowires enable the desired computation in this approach.

Figure 2A:
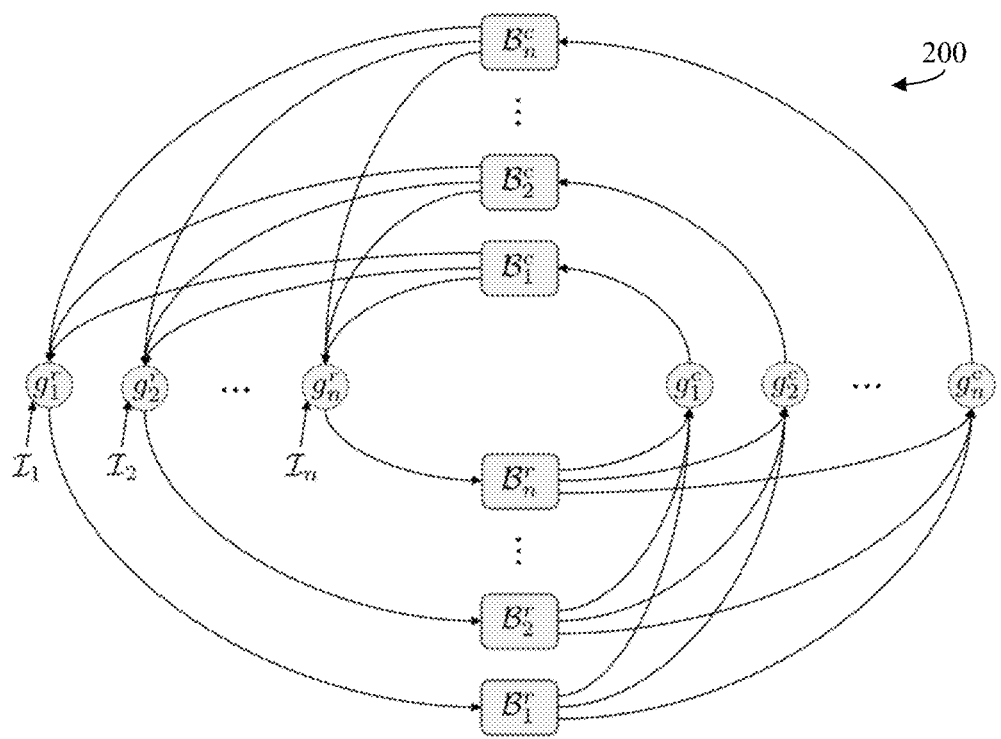
FIGS. 2A-2C, collectively referred to as FIG. 2, illustrate a cyclic Boolean circuit for an example crossbar.
Figure 2B:
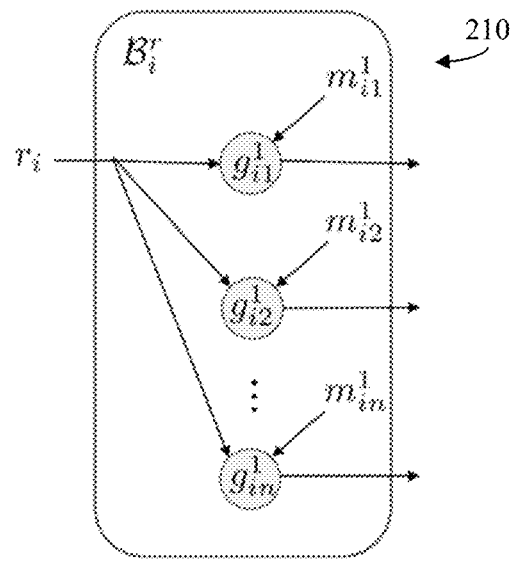
Figure 2C:
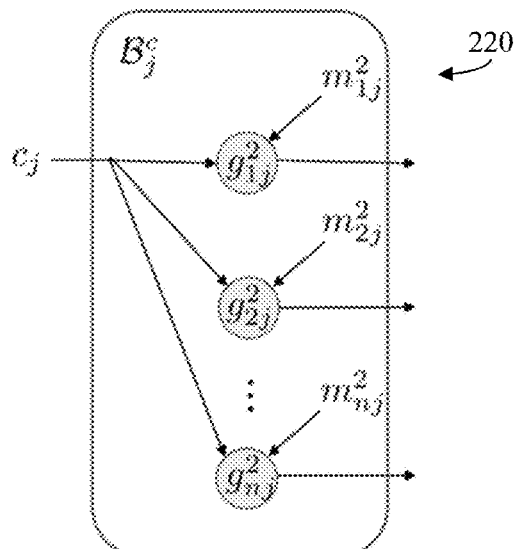

FIGS. 2A-2C, collectively referred to as FIG. 2, illustrate a cyclic Boolean circuit 200 for an example crossbar.

FIG. 2A shows a Cyclic Boolean circuit 200 for a given n×n crossbar $C=(M^1, M^2, R, C)$. FIG. 2B illustrates a $B_i^r$ element 210 and FIG. 2C illustrates a $B_j^c$ element 220. In this circuit 200, each wire $r_i,c_j$ Boolean has a corresponding function $g_i^r:\{0,1\}^{n+1}\mapsto\{0,1\}$, $g_j^c:\{0,1\}^n\mapsto\{0,1\}$ which is a logical disjunction of its inputs. Similarly $g_{ij}^1, g_{ij}^2: \{0,1\}^2\mapsto\{0,1\}$ are 2-bit conjunctions corresponding to the logical output of each $m_{ij}^1$ and $m_{ij}^2$ respectively.

In order to frame the approach in the context of a well-studied parallel computation model and to provide an alternative representation of the architecture, the Boolean circuit model of parallel computation, which is more realistic at the hardware level than the idealistic PRAM model, is utilized. More specifically, cyclic Boolean circuits as these more faithfully replicate the feedback loop behavior are utilized. It can be seen in FIG. 2 that $O(n^2)$ Boolean gates are used given an n×n crossbar.

Despite the abundance of parallel linear algebra packages over the last few decades, parallel implementation of graph algorithms on John von Neumann architectures has consistently been challenging. The transitive closure problem is a well-studied graph theory problem with ubiquitous applications in many different areas. In the theoretical domain, a classic result of Skyum and Valiant demonstrates how problems computable by circuits of polynomial size can be reduced to the transitive closure operation via projections. In more applied domains, this problem underpins many important procedures, such as resolving database queries, parsing grammars, determining data dependencies at compilation, as well as formal verification algorithms such as model checking. Inspired by these applications and motivated by the difficulties of parallelizing transitive closure on John von Neumann architectures, whether the inherently parallel flow of information in 3D crossbar arrays can be used to perform graph transitive closure in an efficient manner was investigated.

Various embodiments solve the transitive closure problem through repeated Boolean matrix multiplication using in-memory computing. The mapping used may be suitable for memories similar to Intel's recently unveiled 3D XPoint™ memory architecture, provided that feedback loops are added externally (such as in FIG. 1). Given a graph $G=(V,E)$, where V is the set of vertices in the graph and $E\in\{0,1\}^{|V|\times|V|}$ its adjacency matrix, the transitive closure of G consists of the matrix X*, where $$X_{ij}^* = \begin{cases} 1 & \text{if } i=j \text{ or there is a path from } v_i \text{ to } v_j \text{ in } G \\ 0 & \text{otherwise} \end{cases}$$

Let $X^{(k)}$ denote the k-reachability matrix specifying which nodes are reachable by a path of at most k edges. Every node has a path of length 0 to itself, thus $X^{(0)}=I$, where I denotes the identity matrix. $X^{(k)}$ can be defined recursively as $X^{(k)}=(I\vee E)^k=X^{(k-1)}X^{(1)}$. Since the maximum length of a path in G is $|V|-1$, then $X^*=X^{|V|-1}=(I\vee E)_{|V|-1}$. However, it is worth noting that a great deal of computations can be spared if the diameter of the graph is known. This follows from the fact that the transitive closure problem converges on a solution after diam(G) (diameter of G) iterations. Thus, $X^*=(I\vee E)^{diam(G)}$. It has been observed that diam(G)<<|V| in real-world networks (See Table 1).

TABLE 1

| Benchmark | Number of nodes | Number of edges | Diameter |
| --- | --- | --- | --- |
| roadNet-PA | 1,088,092 | 1,541,898 | 786 |
| com-Youtube | 1,134,890 | 2,987,624 | 20 |
| as-Skitter | 1,696,415 | 11,095,298 | 25 |
| roadNet-TX | 1,379,917 | 1,921,660 | 1054 |
| soc-Pokec | 1,632,803 | 30,622,564 | 11 |
| roadNet-CA | 1,965,206 | 2,766,607 | 849 |
| wiki-Talk | 2,394,385 | 5,021,410 | 9 |
| com-Orkut | 3,072,441 | 117,185,083 | 9 |
| cit-Patents | 3,774,768 | 16,518,948 | 22 |
| com-LiveJournal | 3,997,962 | 34,681,189 | 17 |
| soc-LiveJournal1 | 4,847,571 | 68,993,773 | 16 |
| com-Friendster | 65,608,366 | 1,806,067,135 | 32 |

Table 1 shows the number of nodes, edges, and diameter for all benchmark graphs exceeding one million nodes from the Stanford Large Network Data Collection. The diameter of the networks is much smaller than their number of nodes.

The above argument concludes that the transitive closure of a graph can be computed using repeated matrix multiplication. Theorem 1 below demonstrates how this procedure is efficiently computed in an n×n crossbar with feedback loops. See FIG. 1 for a simple example.

Theorem 1: Let $C=(M^1, M^2, R, C)$ be an n×n 3D crossbar, X denote a Boolean matrix, I be the n×n identity matrix, and $\gamma \in \{1, \ldots, n\}$ be a row index. If $M^1=X$, $M^2=X^T$ and $(r_{10}, \ldots, r_{n_0})=(I_{\gamma 1}, \ldots, I_m)$, then $r_{it}=(X^{2t})_{\gamma i}$ and $c_{jt}=(X^{2t-1})_{\gamma j}$ at any given time index t.

Proof. The proof is by induction on the time index t.
(Base Case) t=1:

$$c_{j1} = \bigvee_{k=1}^{n} (r_{k0} \wedge m_{kj}^1) \qquad (5)$$

$$= (r_{\gamma 0} \wedge m_{\gamma j}^1) \vee \bigvee_{k \neq \gamma}^{n} (r_{k0} \wedge m_{kj}^1) \qquad (6)$$

$$= r_{\gamma 0} \wedge m_{\gamma j}^1 = m_{\gamma j}^1 = X_{\gamma j} \qquad (7)$$

Equation (5) states that the column nanowire $c_{j1}$ has a flow if and only if a row nanowire has a flow and its corresponding interconnect in layer 1 is in the LRS state. This arises naturally from the design of the crossbar (see Eqn. (4)). Since the premise of the theorem sets wires $r_{i0}$ using a row vector of the identity matrix, all wires $r_{k0}$ such that $\gamma \neq k$ are set to 0. Equations (6) and (7) use this fact to algebraically simplify the first equation.

$$r_{i1} = \bigvee_{j=1}^{n} (c_{j1} \wedge m_{ij}^2) \qquad (8)$$

$$= \bigvee_{j=1}^{n} (X_{\gamma j} \wedge m_{ij}^2) \qquad (9)$$

$$= \bigvee_{j=1}^{n} (X_{\gamma j} \wedge X_{ji}) = (X^2)_{\gamma i} \qquad (10)$$

Equation (8) captures the fact that the row nanowire gets a new flow if and only if one of the column nanowires gets a flow through equations (5) through (7). Equation (9) is the result of algebraically substituting equation (7) into equation (8). Equation (10) is derived using the fact that an interconnect in the second layer of the crossbar is in the LRS state if and only if the corresponding entry in the transpose of the matrix X is 1. The inductive base case is established using equations (7) and (10).

(Inductive Hypothesis): Assume that $r_{it}=(X^{2t})_{\gamma i}$ and $c_{jt}=(X^{2t-1})_{\gamma j}$ for all $\gamma$ and all $i \leq t$.

(Induction): The value of the column nanowire $c_{j,t+1}$ can be computed as follows.

$$c_{j,t+1} = \bigvee_{k=1}^{n} (r_{kt} \wedge m_{kj}^1) = \bigvee_{k=1}^{n} ((X^{2t})_{\gamma k} \wedge m_{kj}^1) \qquad (11)$$

$$= \bigvee_{k=1}^{n} ((X^{2t})_{\gamma k} \wedge X_{kj}) = (X^{2t+1})_{\gamma j} \qquad (12)$$

Equation (11) describes how the flow of current on a column arises from the flow of current on a row nanowire and a corresponding interconnect being in the LRS state. It also leverages the inductive hypothesis that $r_{kt}=(X^{2t})_{\gamma k}$. Equation (12) exploits the fact that the first layer of the crossbar stores the Boolean matrix X. Similarly, the value of the row nanowire $r_{i,t+1}$ can be computed as follows:

$$r_{i,t+1} = \bigvee_{j=1}^{n} (c_{j,t+1} \wedge m_{ij}^2) = \bigvee_{j=1}^{n} ((X^{2t+1})_{\gamma j} \wedge m_{ij}^2) \qquad (13)$$

$$= \bigvee_{j=1}^{n} ((X^{2t+1})_{\gamma j} \wedge X_{ji}) = (X^{2t+2})_{\gamma i} \qquad (14)$$

Equation (13) uses the fact that there is a new flow on a row nanowire if and only if a column nanowire and its corresponding component in the second layer is in the LRS state. It also leverages the result proved in Equation (12) that $c_{j,t}(X^{(2t+1)-1})_{\gamma j}$. Equation (13) is derived using the fact that the transpose of the Boolean matrix X is stored in the second layer of the 3D crossbar.

Hence, $r_{it}=(X^{2t})_{\gamma i}$ and $c_{jt}=(X_{2t-1})_{\gamma j}$ are proven by mathematical induction.

Thus, it is possible to arrive at the transitive closure of a graph G using an in-memory computing architecture that can implement only repeated Boolean matrix multiplication. Theorem 1 is illustrated by the simple example below, where the matrices $X^{(1)}, \ldots, X^{(4)}$ are reachability matrices. It should be clear that the transitive closure is $X^*=X^{(4)}$. A visualization of how $X^*$ is computed within a 5×5 crossbar can be seen in FIG. 3 and its corresponding cyclic Boolean circuit can be seen in FIG. 4.

Figure 3:
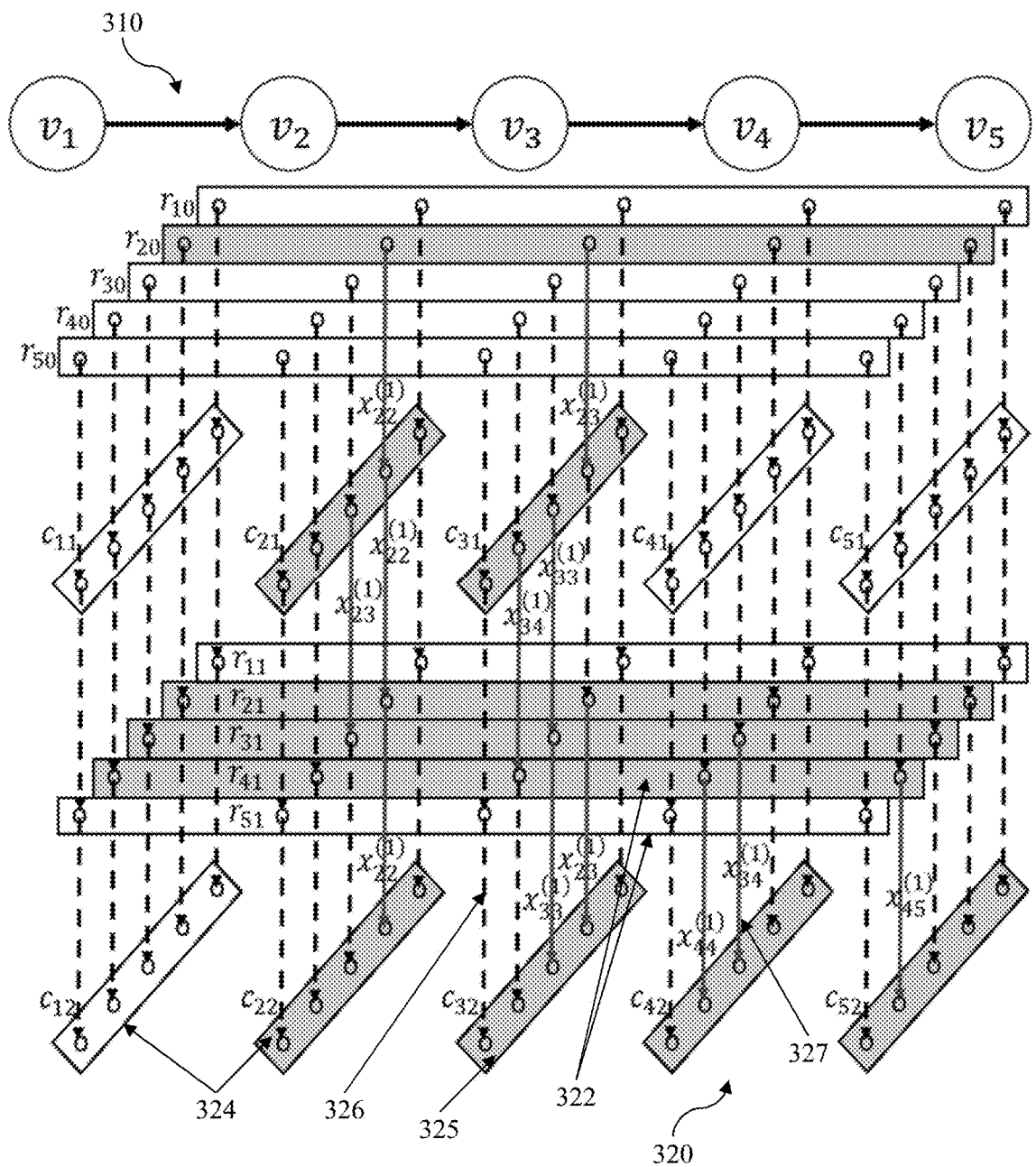
FIG. 3 demonstrates a procedure for computing the transitive closure of a directed graph in accordance with an embodiment.
Figure 4A:
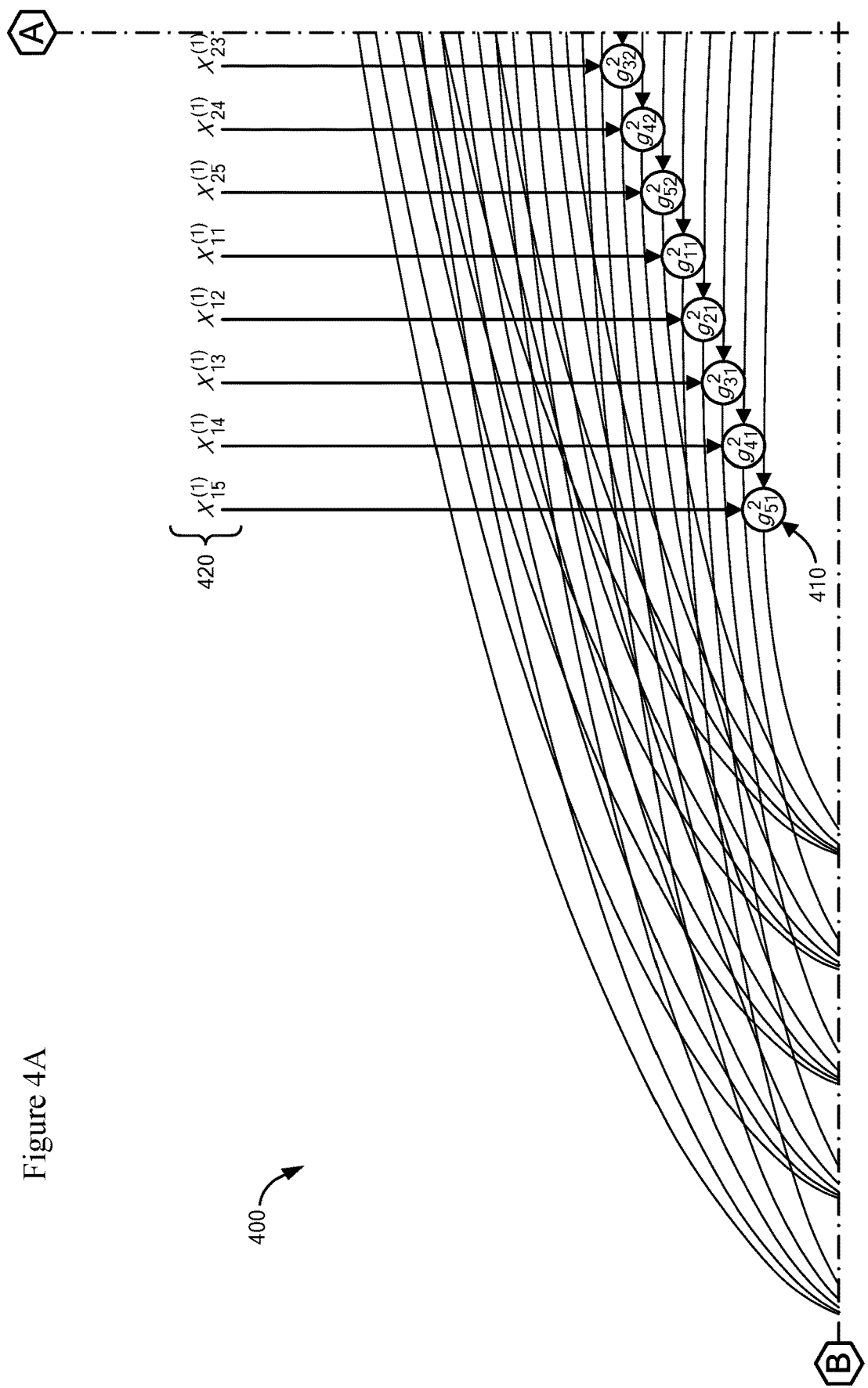
FIGS. 4A-4D illustrate an expanded view of the cyclic Boolean circuit of FIG. 4.
Figure 4B:
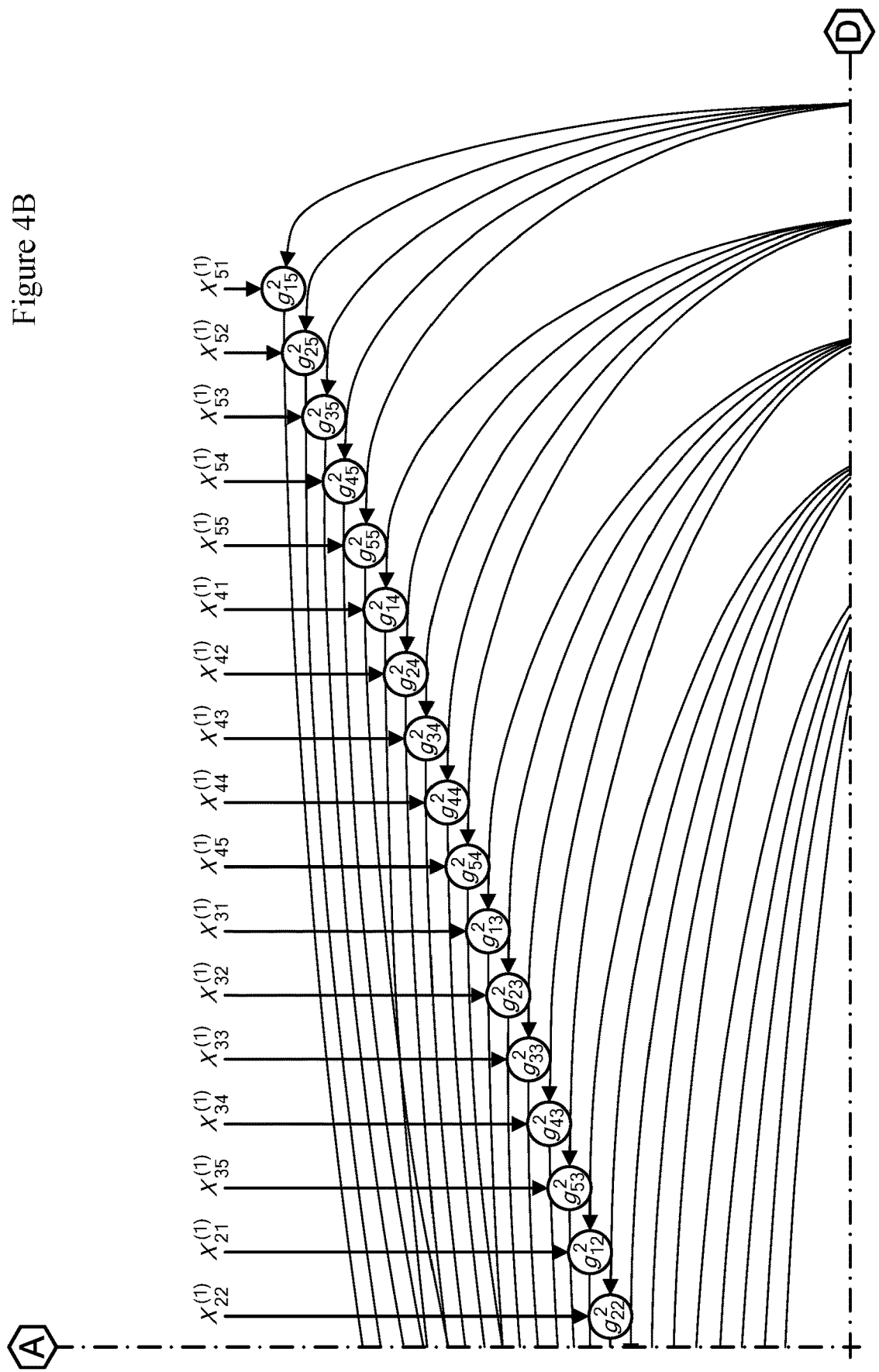
Figure 4C:
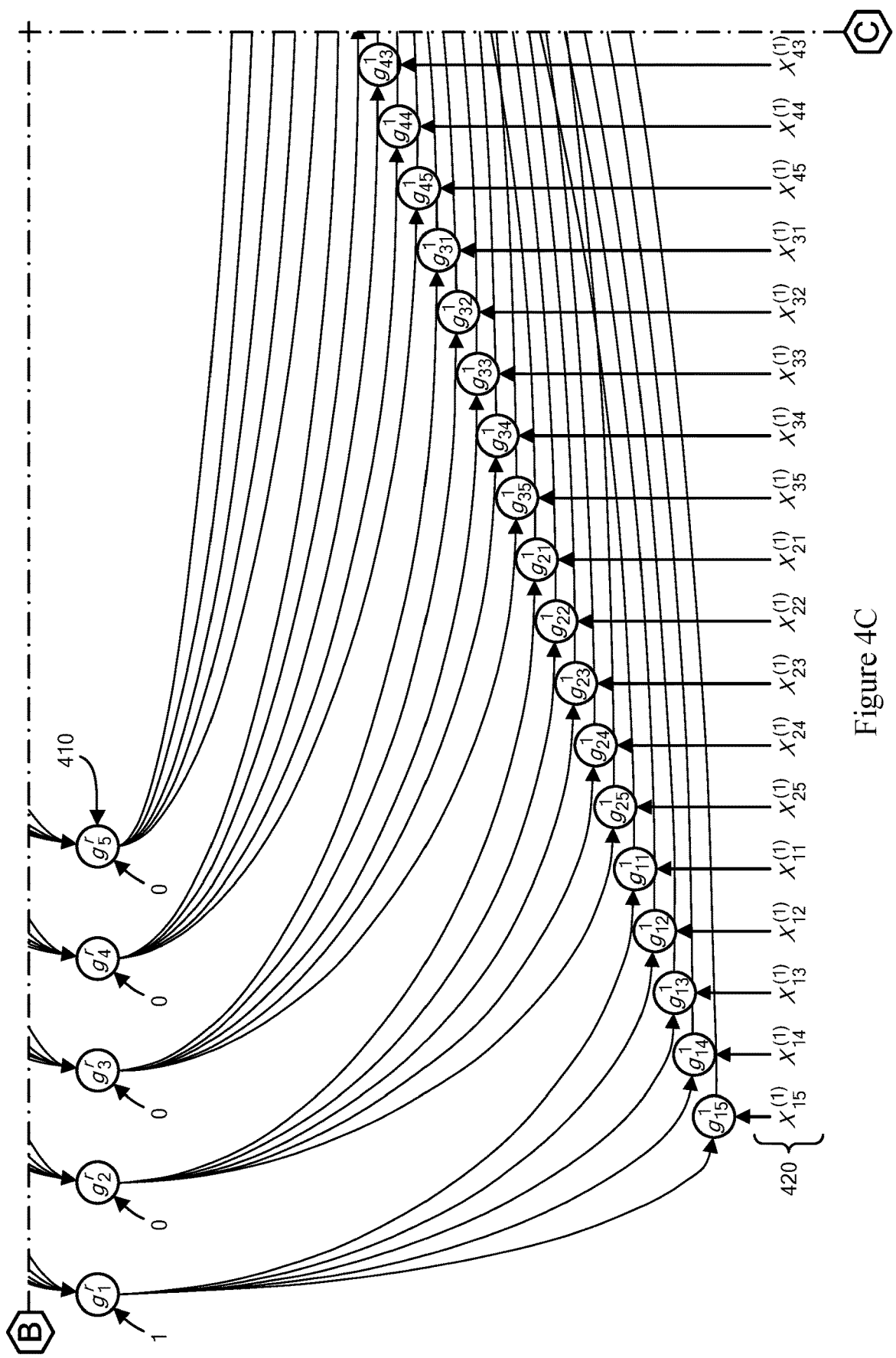
Figure 4D:
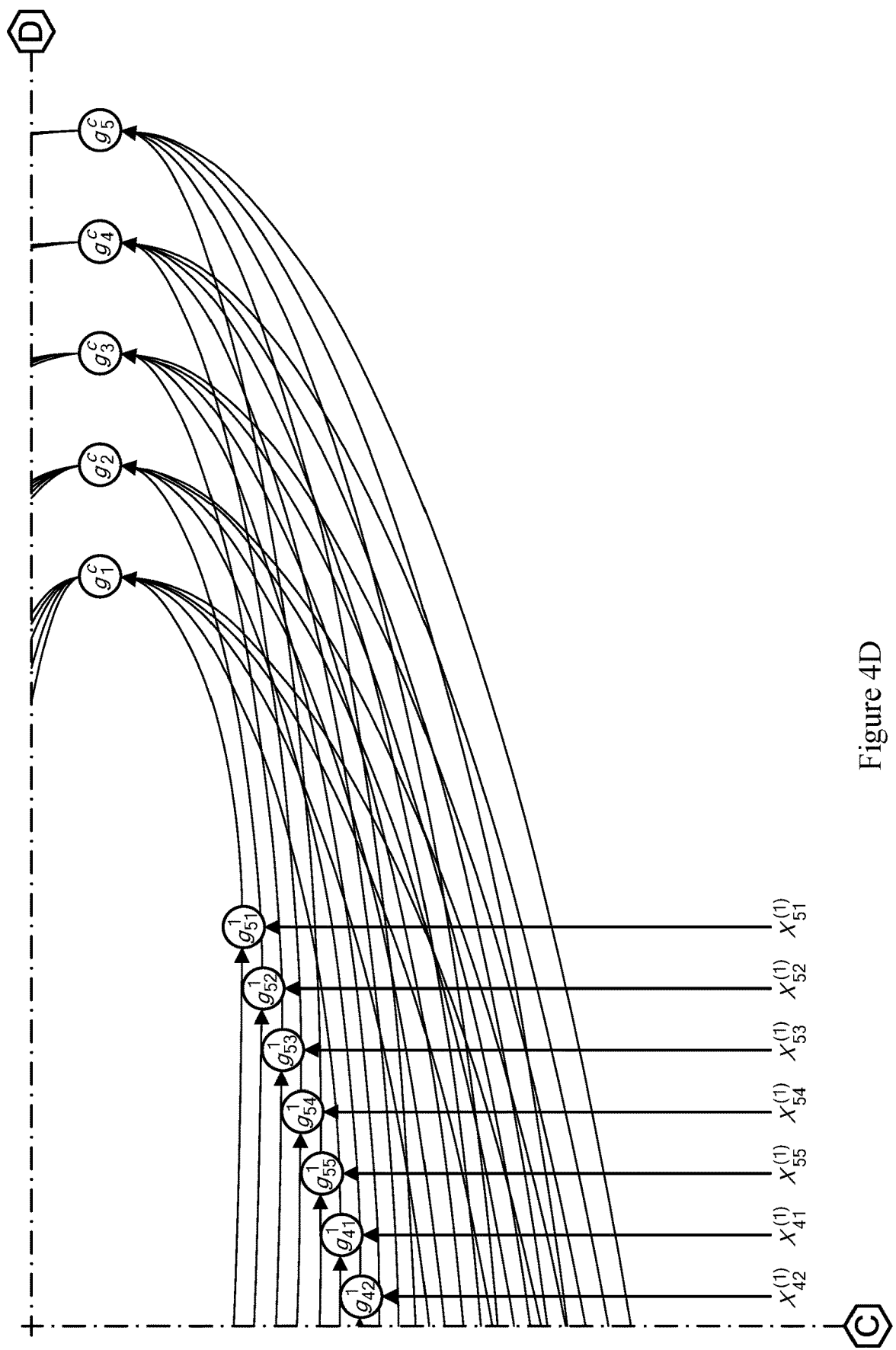

FIG. 3 demonstrates a procedure for computing the transitive closure of a directed graph in accordance with an embodiment. The top 310 of FIG. 3 is a visualization of the graph (or network) G. The bottom part 320 is the procedure for computing the transitive closure of G.

The procedure computes the transitive closure $X^*$ of directed graph 310 $G=(\{v_1, v_2, v_3, v_4, v_5\}, E)$. The two-layer crossbar 320 with feedback loop $C=(M^1, M^2, \{r_1, r_2, r_3, r_4, r_5\}, \{c_1, c_2, c_3, c_4, c_5\})$ is unrolled in order to help visualize the computation. Dashed lines 326 represent interconnections between row 322 and column wires 324, shaded bars 325 denote a wire 322, 324 with a truth value of 1, and solid lines 327 correspond to interconnects redirecting the flow of current from one wire 322, 324 to another. In this case, the second row vector $(x^*_{21}, \ldots, x^*_{25})$ of $X^*$ is computed by setting $(r_{10}, r_{20}, r_{30}, r_{40}, r_{50})=(0,1,0,0,0)$. Note that $(c_{12}, c_{22}, c_{32}, c_{42}, c_{52})=(x^*_{21}, x^*_{22}, x^*_{23}, x^*_{24}, x^*_{25})$.

FIG. 4 illustrates a Boolean circuit 400 for the procedure in FIG. 3 and FIGS. 4A-4D illustrate an expanded view of the cyclic Boolean circuit of FIG. 4. The Boolean gates 410 $g_{ij}^1$ and $g_{ij}^2$ have inputs 420 $X_{ij}^{(1)}$ and $X_{ji}^{(1)}$ in accordance with Theorem 1. Each $g_i^r$ has an input $I_i$ corresponding to the value of $r_{i0}$.

The all-pairs shortest paths problem seeks to compute the shortest length of a path between any pair of nodes in a network. There is a well-known connection between this problem and the transitive closure operation. In fact, these problems become synonymous when dealing with unweighted graphs. While the shortest paths problem minimizes over additions of edge weights, the transitive closure operation performs logical conjunctions and disjunctions over binary edge weights. In the case of an unweighted graph $G=(V,E)$ with k-reachability matrix $X^{(k)}=(I \vee E)^k$, the shortest path length between two nodes $v_\alpha$ and $v_\beta$ can be determined using transitive closure by finding the first t for which $X_{\alpha\beta}^{(t)}=1$, thereby minimizing over the number of edges in a path. Due to these similarities, the mapping proposed in the previous section serves as a precursor to the solution of the single-source and all-pairs shortest paths problems. Such a solution opens up the possibility for a computation-in-memory approach to a variety of interesting problems, such as Gaussian elimination, optimal routing, and generating regular expressions for Deterministic Finite Automata, among others.

Theorem 2 demonstrates that the shortest path length between any two nodes $v_\alpha$ and $v_\beta$ can be determined using the mapping described in the previous section by monitoring the values of the wires corresponding to $r_\beta$ and $c_\beta$.

Theorem 2: Let G=(V,E) denote an unweighted graph, where $|V|=n$ and $X^{(1)}$ denotes the 1-reachability matrix of G. Given an n×n crossbar C=($M^1$, $M^2$, R, C) with $M^1=X^{(1)}$ and $M^2=(X^{(1)})_T$, if the shortest path between $v_\alpha, v_\beta \in V$ is of length τ, then $r_{\beta,\tau/2} \wedge \neg c_{\beta,\tau/2}$ holds if τ is even and $\neg r_{\beta,(\tau-1)/2} \wedge c_{\beta,(\tau+1)/2}$ holds if T is odd.

Proof. Let $(r_{10}, \ldots, r_{n0}) = (I_{\alpha 0}, \ldots, I_{\alpha n})$. From Theorem 1, $r_{it} = ((X^{(1)})^{2t})_{\alpha i}$ and $c_{jt} = ((X^{(1)})^{2t-1})_{\alpha j}$. Two cases arise.

τ even:

$$r_{\beta,\tau/2} = ((X^{(1)})^\tau)_{\alpha\beta} = X_{\alpha\beta}^{(\tau)} \quad (15)$$

$$c_{\beta,\tau/2} = ((X^{(1)})^{\tau-1})_{\alpha\beta} = X_{\alpha\beta}^{(\tau-1)} \quad (16)$$

Since the shortest path is of length τ, it follows that $X_{\alpha\beta}^{(\tau-1)}=0$ and $X_{\alpha\beta}^{(\tau)}=1$. Therefore, $r_{\beta,\tau/2} \wedge c_{\beta,\tau/2}$ must hold.

τ odd:

$$r_{\beta,(\tau-1)/2} = ((X^{(1)})^\tau)_{\alpha\beta} = X_{\alpha\beta}^{(\tau)} \quad (17)$$

$$c_{\beta,(\tau+1)/2} = ((X^{(1)})^\tau)^{\alpha\beta} = X_{\alpha\beta}^{(\tau)} \quad (18)$$

Since the shortest path is of length τ, it follows that $X_{\alpha\beta}^{(\tau-1)}=0$ and $X_{\alpha\beta}^{(\tau)}=1$. Therefore, $\neg r_{\beta,(\tau-1)/2} \wedge c_{\beta,(\tau+1)/2}$ must hold.

It follows as a corollary to Theorem 2 that the length of the shortest path from $v_\alpha$ to $v_\beta$ can be obtained by applying a voltage to the wire corresponding to $r_\alpha$, grounding wires $r_k$ (k≠α), and reading the values of wires $r_\beta$ and $c_\beta$ for every feedback loop iteration until $r_\beta \oplus c_\beta$ holds. This approach allows solving the single-source shortest paths problem with some added circuitry to continuously monitor the values of $r_{\beta,t}$ and $c_{\beta,t}$. Repeating this operation for each $\alpha \in \{1, \ldots, n\}$ yields a solution to the all-pairs shortest paths problem.

Given a graph G=(V,E) with $|V|=n$ and a crossbar C=($M^1$, $M^2$, R, C), the mapping discussed above uses $O(n^2)$ devices to store only one copy of the graph. Since the maximum length of a path is n−1, it only computes $(1\vee E)^{n-1}$. It follows from Theorem 1 that, if $M^1=(I \vee E)$ and $M^2=(I \vee E)^T$, then $c_{j,n/2} = (I \vee E)_{\gamma j}^{2(n/2)-1} = (I \vee E)_{\gamma j}^{n-1}$. Because this computation is be done for every $\gamma \in \{1, \ldots, n\}$, there is a time complexity of $O(n^2)$ for the transitive closure and all pairs shortest paths problems. The single-source variants of these problems can be solved in O(n) operations since it is possible to compute values for only one $\gamma \in \{1, \ldots, n\}$.

As a point of comparison, a straightforward parallelization of Floyd's algorithm, which is itself a generalization of transitive closure, yields a time complexity of $O(n^3/p+n^2 \log p)$ given p processors. This leads to a runtime of $O(n^2 \log n^2)$ using $n^2$ processors as compared to the $O(n^2)$ runtime using $O(n^2)$ devices.

An efficient in-memory hardware solution to the transitive closure problem can be a precursor to other fast graph algorithms. This is due to the dependence of reachability problems for undirected graphs on the transitive closure procedure. This has been well-documented and poses a significant hurdle in the parallelization of several graph algorithms on John von Neumann architectures.

In order to cement the validity and effectiveness of the approach, simulations were carried out using HSPICE and NVSim. The HSPICE simulations were performed under the following parameters. The resistive components of the 1D1R interconnects corresponding to $m_{ij}^k=1$ have a resistance of 1 mΩ, devices corresponding to $m_{ij}^k=0$ have a resistance of 1 GΩ, and resistors to ground have a resistance of 1 kΩ. For the choice of diode model, a Super Barrier Rectifier (SBR) SPICE model SBR3U20SA designed by Diodes Incorporated is used. These SBRs have been shown to have lower forward voltages and leakage currents when compared to Schottky diodes.

The approach was tested on random Boolean matrices of various sizes. For crossbars of sizes 4×4, 8×8, 16×16, 32×32, 64×64, and 128×128, 100 random matrices are sampled and their transitive closure computed using the approach. See Table 2 for results. There is a margin of two orders of magnitude between 1 and 0 values in the average case and there is an order of magnitude gap in the worst case; that is, in the case where the minimal 1 value and the maximal 0 value are compared.

In defining these random matrices, a Bernoulli distribution is utilized to determine the probability $p(v_i, v_j)$ of two nodes being connected by an edge. This probability is set as the threshold function (19) for Bernoulli graphs.

$$T(n) = \frac{\log(n)}{n} \quad (19)$$

Given a graph G=(V,E), connectivity probabilities $P(v_i, v_j)=T(|V|)$ are chosen according to equation (19) for the simulation in Table 2 above. This threshold function was chosen because it can be shown that if $P(v_i,v_j)=kT(|V|)$, the probability of a graph being connected approaches 0 (1) if k<1 (k>1). This provides a good mix of values in the transitive closure matrices.

TABLE 2

| Crossbar dimensions | Minimal true reading | Maximal false reading | Average true reading | Average false reading | Standard Deviation of true readings | Standard Deviation of false readings |
|---|---|---|---|---|---|---|
| 4 × 4 | 4.3156 V | 0.0480 V | 4.7615 V | 0.0129 V | 0.5049 V | 0.0012 V |
| 8 × 8 | 3.9149 V | 0.0800 V | 4.6341 V | 0.0194 V | 0.9855 V | 0.0027 V |
| 16 × 16 | 3.8664 V | 0.0960 V | 4.5495 V | 0.0136 V | 1.4698 V | 0.0051 V |
| 32 × 32 | 3.8324 V | 0.1280 V | 4.4959 V | 0.0326 V | 1.6871 V | 0.0131 V |
| 64 × 64 | 3.8383 V | 0.1601 V | 4.4231 V | 0.1021 V | 2.2237 V | 0.0050 V |
| 128 × 128 | 3.8303 V | 0.1762 V | 4.3458 V | 0.1195 V | 2.7045 V | 0.0061 V |

Table 2 shows the HSPICE simulation results of graph transitive closure computation using the 3D crossbars. The first column denotes crossbar sizes. For each row in the table, the transitive closures of 100 random matrices were computed and the minimal voltage reading corresponding to a value of 1, or true, was recorded in the first column. The maximal value corresponding to a value of 0 was also recorded, as were the average and standard deviations of false and true voltage readings. There is a two-orders-of-magnitude gap between true and false readings in the average case and there is an order of magnitude gap in the worst case; that is, in the case where the minimal true value and the maximal false value are compared.

In order to test the latency and energy efficiency of the approach, the architecture is modeled within the NVSim non-volatile memory simulation environment. For the resistive component of the 1D1R interconnects, the memristor is modeled. This memristor exhibits a switching time of 85 ps under a 2 V pulse with switching currents below 15 µA, leading to a switching energy of 3 fJ. The read and write latencies and energies for memories of various sizes under this configuration are presented in Table 3. These values are used to determine the computation time and energy consumed by the approach when computing the transitive closure of graphs with tens of thousands of nodes. These results are reported in Table 4. The transitive closure of networks with thousands of nodes can be computed using less energy (1.496 nJ for the p2p-Gnutella09 benchmark) than it takes to access DRAM (1.3-2.6 nJ).

The write latency and write energy dominate the computation time and energy consumed in the benchmarks presented. Thus, the graph-theoretic platform presented may be further developed so that multiple algorithms may be run on the stored graph data. This allows users to only configure the memory once, thereby minimizing latency and energy usage.

TABLE 3

| Memory capacity | Read latency (ns) | Write latency (ns) | Read energy (nJ) | Write energy (nJ) |
| --- | --- | --- | --- | --- |
| 1 MB | 0.913 | 3.623 | 0.029 | 0.063 |
| 4 MB | 1.693 | 7.139 | 0.056 | 0.227 |
| 16 MB | 4.417 | 15.647 | 0.11 | 0.862 |
| 64 MB | 14.598 | 38.641 | 0.219 | 3.359 |
| 256 MB | 53.928 | 108.579 | 0.437 | 13.268 |

Table 3 shows the latency and power metrics of the proposed architecture for various memory capacities using the NVSim simulator.

TABLE 4

| Benchmark | Number of Nodes | Time (Read) | Time (Write + Read) | Energy (Read) | Energy (Write + Read) |
| --- | --- | --- | --- | --- | --- |
| ego-Facebook | 4,039 | 24.04 ns | 69.664 µs | 0.601 nJ | 2.786 µJ |
| wiki-Vote | 7,115 | 43.939 ns | 315.55 µs | 1.047 nJ | 21.136 µJ |
| p2p-Gnutella09 | 8,114 | 62.77 ns | 315.57 µs | 1.496 nJ | 21.137 µJ |
| ca-HepPh | 12,008 | 230.594 ns | 426.215 µs | 3.883 nJ | 164.368 µJ |
| ca-AstroPh | 18,772 | 866.11 ns | 9.977 ms | 8.397 nJ | 1.296 mJ |
| p2p-Gnutella25 | 22,687 | 618.65 ns | 9.976 ms | 5.998 nJ | 1.296 mJ |
| ca-CondMat | 23,133 | 866.11 ns | 9.977 ms | 8.397 nJ | 1.296 mJ |
| p2p-Gnutella24 | 26,518 | 618.65 ns | 9.977 ms | 5.998 nJ | 1.296 mJ |
| cit-HepTh | 27,770 | 804.245 ns | 9.977 ms | 7.797 nJ | 1.296 mJ |

Table 4 shows the computation time and energy usage metrics for various benchmark circuits taken from the Stanford Large Network Data Collection. These networks are mapped to the memories presented in Table 3 and the aforementioned metrics are reported. In the (Read) columns, values are reported that correspond to memories whose cells contain the contents of the network. The (Write+Read) columns assume that the memories are first configured to contain the contents of the network.

Figure 5:
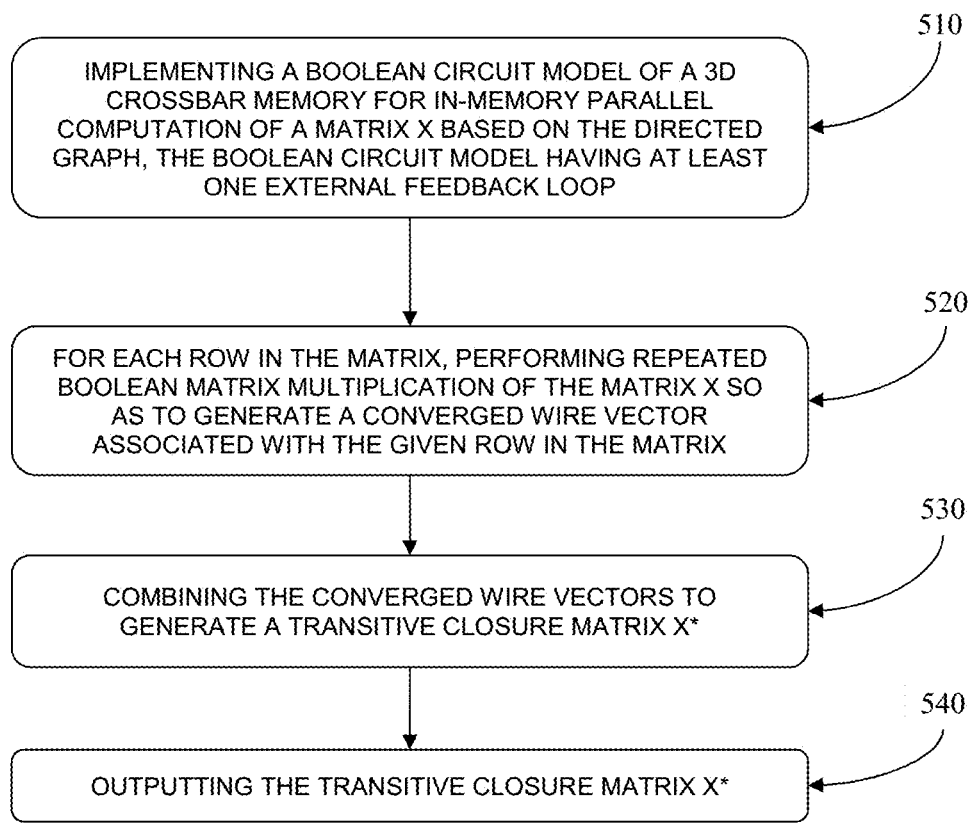
FIG. 5 is a logic flow diagram that illustrates the operation of a method, and a result of execution of computer program instructions embodied on a computer readable memory, in accordance with various embodiments.

FIG. 5 is a logic flow diagram illustrating a method, and a result of execution of computer program instructions embodied on a memory, in accordance with an embodiment. The embodiment provides a method for computing a transitive closure of a directed graph. The method includes, at block 510, implementing a Boolean circuit model of a 3D crossbar memory for in-memory parallel computation of a matrix X based on the directed graph. The Boolean circuit model having at least one external feedback loop. At block 520, for each row in the matrix, the method performs repeated Boolean matrix multiplication of the matrix X so as to generate a converged wire vector associated with the given row in the matrix. Combining the converged wire vectors to generate a transitive closure matrix X* is performed at block 530. The method also includes, at block 540, outputting the transitive closure matrix X*.

Various embodiments that provide a new in-memory computing design for obtaining the transitive closure of a graph using a crossbar with two layers of interconnects have been presented. This procedure uses the addition of external feedback loops to already existing 3D memories. One non-limiting embodiment provides an approach that is both fast and energy-efficient on practical networks obtained from the Stanford Large Network Data Collection. This framework may be expanded to solve the problem of parsing context-free grammars (CFG) efficiently within memory as it has been shown that fast CFG parsing can use efficient transitive closure algorithms. The hardware parallelization of other graph algorithms via in-memory computing may also be enabled.

Various operations described are purely exemplary and imply no particular order. Further, the operations can be used in any sequence when appropriate and can be partially used. With the above embodiments in mind, it should be understood that additional embodiments can employ various computer-implemented operations involving data transferred or stored in computer systems. These operations are those using physical manipulation of physical quantities. Usually, though not necessarily, these quantities take the form of electrical, magnetic, or optical signals capable of being stored, transferred, combined, compared, and otherwise manipulated.

Any of the operations described that form part of the presently disclosed embodiments may be useful machine operations. Various embodiments also relate to a device or an apparatus for performing these operations. The apparatus can be specially constructed for the purpose, or the apparatus can be a general-purpose computer selectively activated or configured by a computer program stored in the computer. In particular, various general-purpose machines employing one or more processors coupled to one or more computer readable medium, described below, can be used with computer programs written in accordance with the teachings herein, or it may be more convenient to construct a more specialized apparatus to perform the operations.

The procedures, processes, and/or modules described herein may be implemented in hardware, software, embodied as a computer-readable medium having program instructions, firmware, or a combination thereof. For example, the functions described herein may be performed by a processor executing program instructions out of a memory or other storage device.

The foregoing description has been directed to particular embodiments. However, other variations and modifications may be made to the described embodiments, with the attainment of some or all of their advantages. Modifications to the above-described systems and methods may be made without departing from the concepts disclosed herein. Accordingly, the invention should not be viewed as limited by the disclosed embodiments. Furthermore, various features of the described embodiments may be used without the corresponding use of other features. Thus, this description should be read as merely illustrative of various principles, and not in limitation of the invention.

What is claimed is:

1. A computer-implemented method for simulating operation of a physical system having a plurality of physical subsystems, for computing a transitive closure of a directed graph, G, comprising:

implementing a Boolean circuit model of a 3D crossbar memory for in-memory parallel computation of a matrix X based on the directed graph G, wherein the Boolean circuit model of the 3D crossbar memory consists of at least two layers of memory cells, each memory cell being in a binary state of 1, describing a low-resistance state, or a binary state of 0, describing a high-resistance state, wherein the Boolean circuit model includes a topmost set of row wires where voltages are applied to read the binary state of the memory cells, wherein a memory cell with a binary state of 1 permits a high current to be redirected between two connected wires and a memory cell with a binary state of 0 inhibits current from one connected wire to another connected wire, wherein a first layer of memory cells connect the topmost row wires to column wires, wherein a second layer of memory cells connect the column wires with a set of bottommost row wires, wherein the bottommost row wires are connected to the topmost row wires via feedback loops and, wherein the Boolean circuit model having at least one external feedback loop;

for each row in the matrix, performing repeated Boolean matrix multiplication of the matrix X so as to generate a converged wire vector associated with the given row in the matrix;

combining the converged wire vectors to generate a transitive closure matrix X*; and outputting the transitive closure matrix X*.

2. The computer-implemented method for simulating operation of a physical system having a plurality of physical subsystems of claim 1, wherein a first layer of the 3D crossbar memory stores the matrix X and a second layer of the 3D crossbar memory stores a transpose of the matrix X.

3. The computer-implemented method for simulating operation of a physical system having a plurality of physical subsystems of claim 1, wherein the graph G=(V,E), where V is the set of vertices in the graph G and $E \in \{0,1\}^{|V| \times |V|}$ the adjacency matrix of the graph G.

4. The computer-implemented method for simulating operation of a physical system having a plurality of physical subsystems of claim 3, wherein the transitive closure matrix X* is the matrix X*, where $$X_{ij}^* = \begin{cases} 1 & \text{if } i = j \text{ or there is a path from } v_i \text{ to } v_j \text{ in } G \\ 0 & \text{otherwise} \end{cases}.$$

5. The computer-implemented method for simulating operation of a physical system having a plurality of physical sub systems of claim 1, wherein the graph G is an unweighted graph.

* * * * *